(12) United States Patent
Whittaker et al.

(10) Patent No.: US 10,802,100 B2
(45) Date of Patent: Oct. 13, 2020

(54) METHOD FOR OBTAINING MAGNETIC RESONANCE IMAGING (MRI) ECHO-PLANAR IMAGE (EPI) DATA

(71) Applicants: Siemens Healthcare Limited, Camberley (GB); University College Cardiff Consultants Ltd., Cardiff (GB); Siemens Healthcare GmbH, Erlangen (DE)

(72) Inventors: Joseph Whittaker, Cardiff (GB); Patrick Liebig, Erlangen (DE); Fabrizio Fasano, Cardiff (GB); Robin Heidemann, Litzendorf (DE); Kevin Murphy, Cardiff (GB)

(73) Assignees: Siemens Healthcare Limited, Camberley (GB); Siemens Healthcare GmbH, Erlangen (DE); University College Cardiff Consultants Ltd., Cardiff (GB)

( * ) Notice: Subject to any disclaimer, the term of this patent is extended or adjusted under 35 U.S.C. 154(b) by 0 days.

(21) Appl. No.: 16/428,706

(22) Filed: May 31, 2019

(65) Prior Publication Data

US 2019/0369194 A1  Dec. 5, 2019

(30) Foreign Application Priority Data

May 31, 2018  (GB) .................................. 1808958.1

(51) Int. Cl.
*G01R 33/561* (2006.01)
*G01R 33/56* (2006.01)
*G01R 33/483* (2006.01)

(52) U.S. Cl.
CPC ..... *G01R 33/5616* (2013.01); *G01R 33/4833* (2013.01); *G01R 33/5608* (2013.01)

(58) Field of Classification Search
CPC ............ G01R 33/4833; G01R 33/5616; G01R 33/5608
See application file for complete search history.

(56) References Cited

U.S. PATENT DOCUMENTS

| 5,195,524 A | 3/1993 | Takiguchi et al. |
| 5,857,970 A | 1/1999 | Purdy |

(Continued)

OTHER PUBLICATIONS

O. Viessmann—Cardiac cycle-induced EPI time series fluctuations in the brain: Their temporal shifts, inflow effects and T2* fluctuations. NeuroImage 162 (2017) 93-105; 2017.

(Continued)

*Primary Examiner* — Gregory H Curran
(74) *Attorney, Agent, or Firm* — Schiff Hardin LLP

(57) ABSTRACT

A method for obtaining magnetic resonance imaging (MRI) echo-planar image (EPI) data, including providing a homogeneous, static background field; providing a gradient field to select a slice of an object for imaging; applying Radiofrequency (RF) pulses to excite magnetic resonance in the selected slice; and measuring a radio frequency signal emitted by the selected slice containing image data. The RF pulses are repeatedly applied separated by a time period shorter than a recovery time of static material in the selected slice such that the static material remains in a state of magnetic saturation, while dynamic material arriving within the slice since a previous RF pulse is not magnetically saturated.

6 Claims, 5 Drawing Sheets

(56) References Cited

U.S. PATENT DOCUMENTS

| | | | |
|---|---|---|---|
| 10,330,762 B2* | 6/2019 | Qin | G01R 33/5607 |
| 2005/0040824 A1 | 2/2005 | Zhang | |
| 2013/0116540 A1* | 5/2013 | Li | G06T 7/0016 |
| | | | 600/410 |
| 2014/0275960 A1* | 9/2014 | Hubbard | A61B 5/055 |
| | | | 600/410 |
| 2017/0119259 A1 | 5/2017 | Giri et al. | |

OTHER PUBLICATIONS

Bianciardi, M., et al.,—The pulsatility volume index: an indicator of cerebrovascular compliance based on fast magnetic resonance imaging of cardiac and respiratory pulsatility; Philos Trans A Math Phys Eng Sci, 2016. 374(2067).

J.W. Robertson et al. Variability of middle cerebral artery blood flow with hypercapnia in women. Ultrasound Med Biol, 2008. 34(5): p. 730-40.

Verbree, J., et al., Assessment of middle cerebral artery diameter during hypocapnia and hypercapnia in humans using ultra-high-field MRI; J Appl Physiol (1985), 2014. 117(10): p. 1084-9.

\* cited by examiner

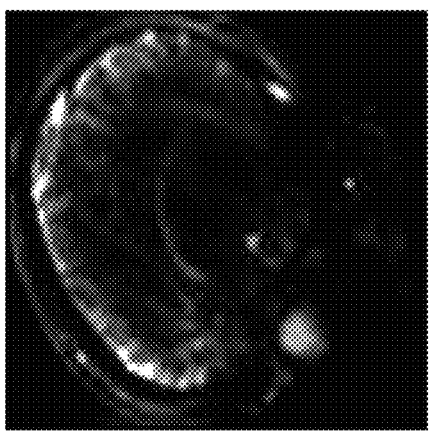 FIG 1B-2  TR = 30ms
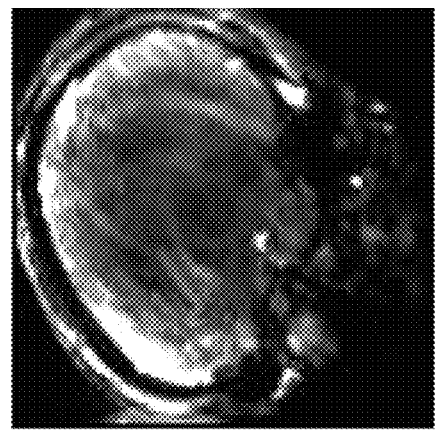 FIG 1B-4  TR = 120ms
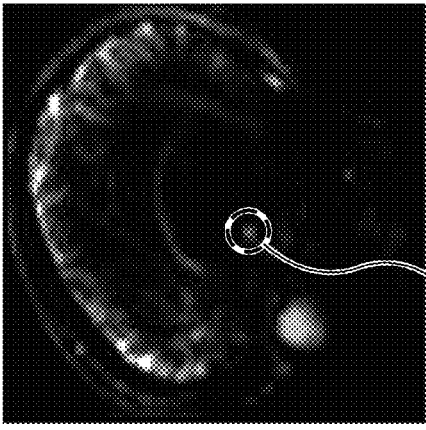 FIG 1B-1  TR = 15ms  MCA
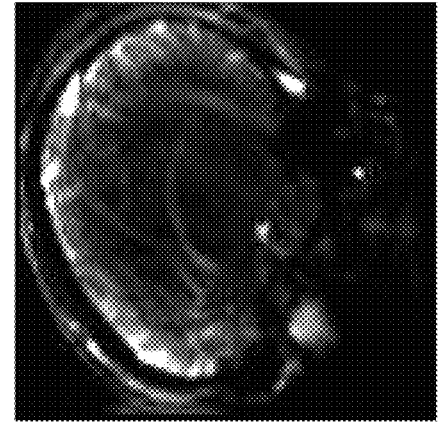 FIG 1B-3  TR = 60ms

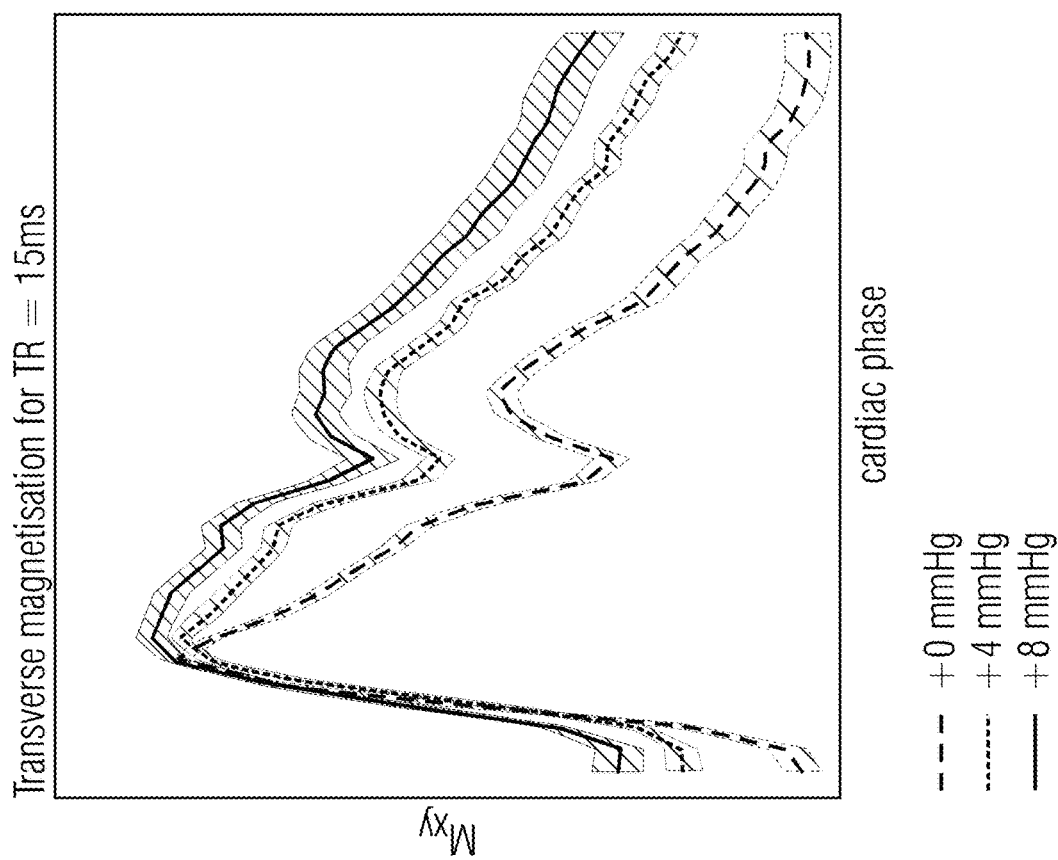
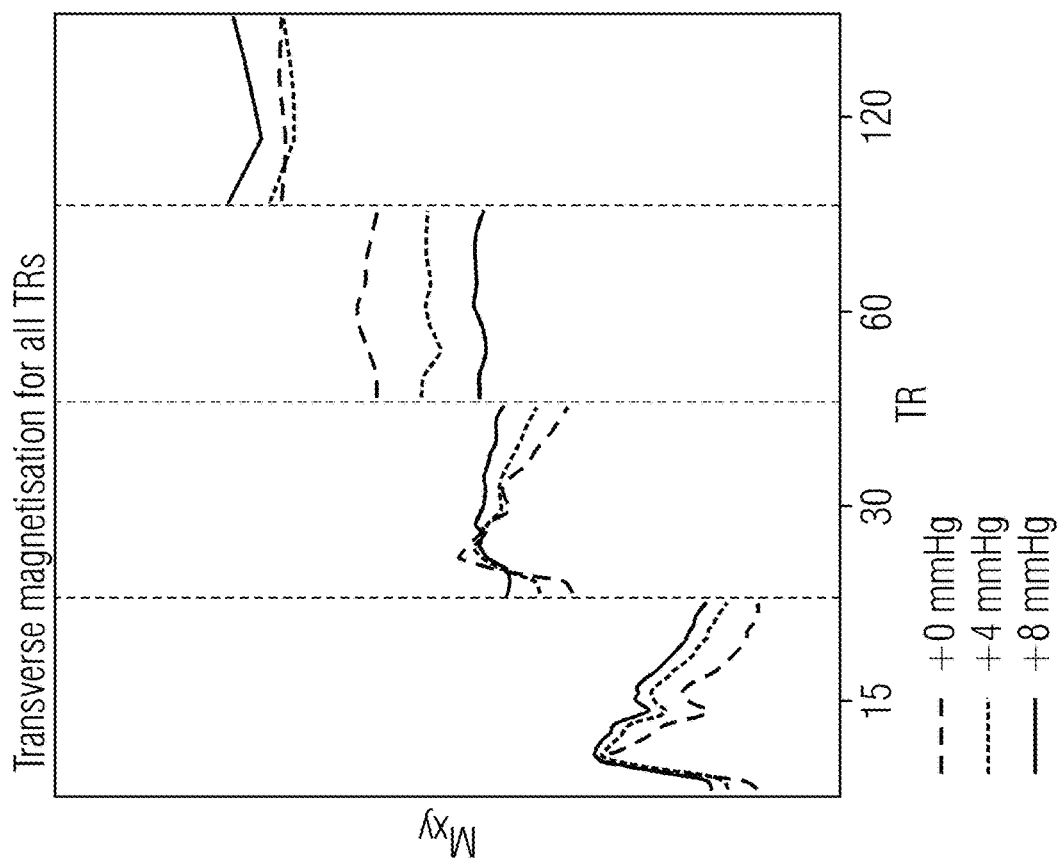

$PR = (peak1-baseline)/(peak2-baseline)$
$PI = (peak1-baseline)/mean$

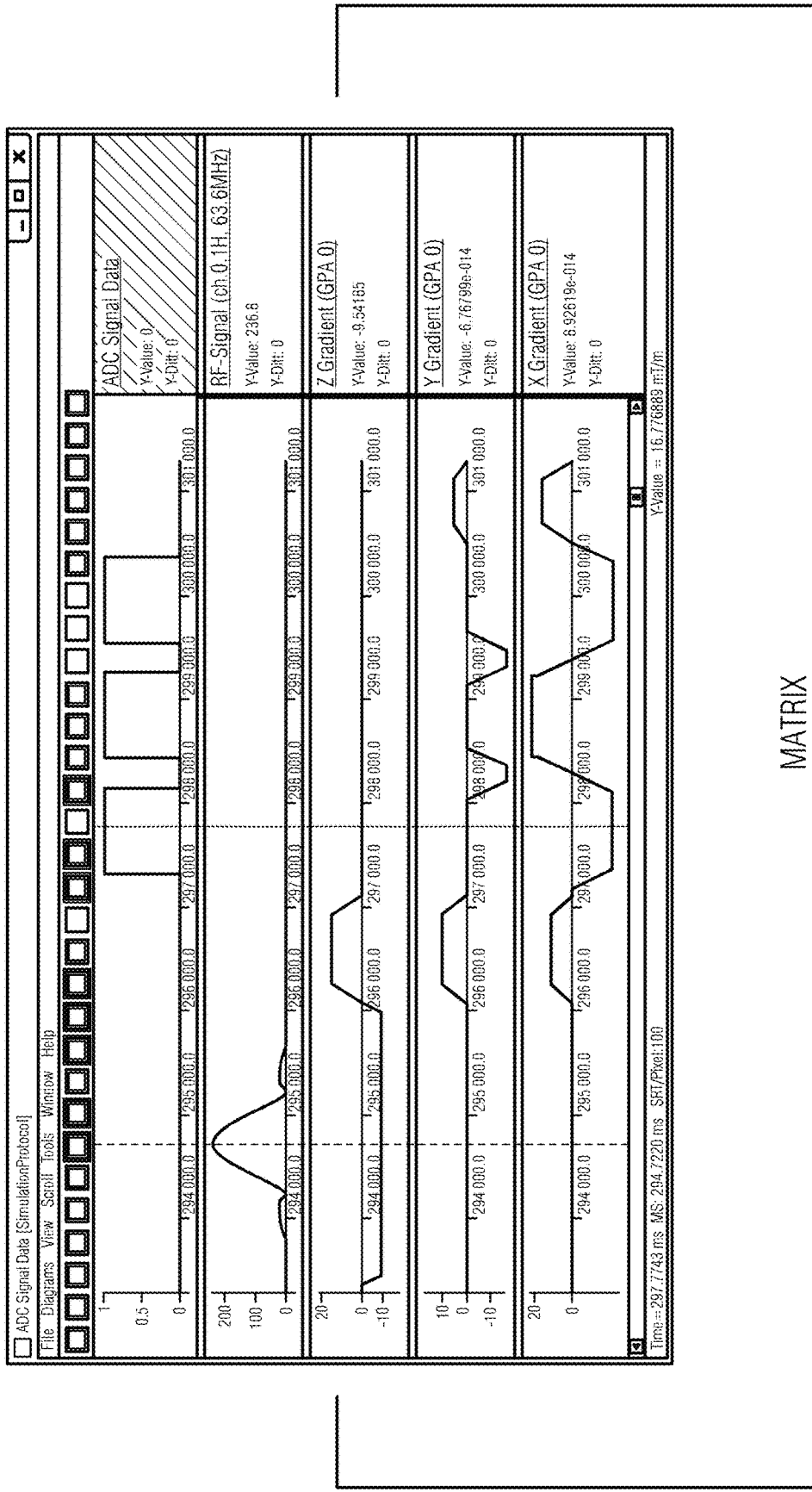

METHOD FOR OBTAINING MAGNETIC RESONANCE IMAGING (MRI) ECHO-PLANAR IMAGE (EPI) DATA

TECHNICAL FIELD

The present disclosure relates to cerebral Magnetic Resonance Imaging, and in particular, imaging of cerebral blood flow.

BACKGROUND

Biomechanical properties such as compliance and resistance of cerebral blood vessels is an important marker of cerebrovascular function in health and disease monitoring. Here, "compliance" is akin to "flexibility" and indicates a reaction of the blood vessel to a pressure wave of blood.

Travelling pressure waves associated with the cardiac cycle provide an endogenous source of pulsatile flow and volume changes in cerebral vessels, from which an assessment of the biomechanical properties of the cerebrovasculature can be derived. Conventional measurement techniques have not provided sufficient temporal resolution to evaluate the contribution of different phases of cardiac (heart-beat) cycle. Attempts to increase temporal resolution have largely resulted in a reduction of spatial resolution below a useful level. The present disclosure aims to provide an imaging technique with improved spatial and temporal resolution to enable evaluation of the contribution of vascular flow resistance during different phases of the cardiac cycle, and to establish a healthy or diseased state of the blood vessel.

Recent evidence suggests that brain-cardiac interactions are highly relevant in clinical cerebrovascular conditions. Standard clinical practice would benefit from a consolidated technique for assessing physiological brain-cardiac interactions in a dynamic fashion.

Magnetic resonance imaging (MRI) may in principle allow for dynamic measurement of cerebrovascular function for clinical appraisal, by rapidly sampling tissue magnetization changes that result from physiological brain-cardiac interactions. In practice, such methods have been limited by the achievable spatial and/or temporal imaging resolution. The present disclosure seeks to provide improved spatial and/or temporal imaging resolution in magnetic resonance imaging for dynamic measurement of cerebrovascular function, in particular to detect blood inflow.

Recently, accelerated EPI has been proposed as a desirable approach to explore cerebrovascular compliance. Techniques have been proposed to assess the cerebrovascular compliance by estimation of arterial signal fluctuations. Due to a repetition time (TR) shorter than the cardiac cycle, such procedures showed some signal fluctuations in brain vessels due to the cardiac cycle. Measured MRI signals, affected by cerebral blood volume and flow velocity changes (CBV, CBVF), discriminated different brain regions in function of their different cerebrovascular dynamic. Nevertheless, the temporal scale of the acquisition methods proposed therein cannot monitor with high resolution the signal produced by the cerebrovascular dynamic on a beat-to-beat basis. That is to say, the repetition time (TR) of the MRI acquisition is too long to provide CBF and CBVF profiles during a cardiac phase cycle. The methods proposed cannot disentangle arterial blood inflow effects from other effects of vascular dynamic.

The present disclosure provides an improved method for assessing vascular resistance and compliance in large cerebral arteries, using MRI imaging, by exploiting an inflow effect on the magnitude signal of ultra-fast echo-planar imaging (EPI).

BRIEF DESCRIPTION OF THE DRAWINGS

The present disclosure may be better understood by reference to the following description of certain embodiments thereof, given by way of non-limiting examples only, in conjunction with the accompanying drawings, wherein:

FIGS. 1B-1 through 1B-4 shows mean data for four different TRs from a representative subject;

FIG. 2 displays results of the MCA time series and corresponding power spectrum for a representative subject;

FIGS. 3A and 3B illustrate example cardiac waveforms;

FIGS. 4A, 4B-1, and 4B-2 show features of the transverse magnetization pulsatile waveform and definitions for quantitative waveform analysis, and scatter plots for Peak Ratio (PR) and Pulsatility (PI) indices across multiple hypercapnia conditions; and FIG. 5 illustrates an example acquisition scheme according to an embodiment of the present disclosure.

DETAILED DESCRIPTION

Figure 1A:
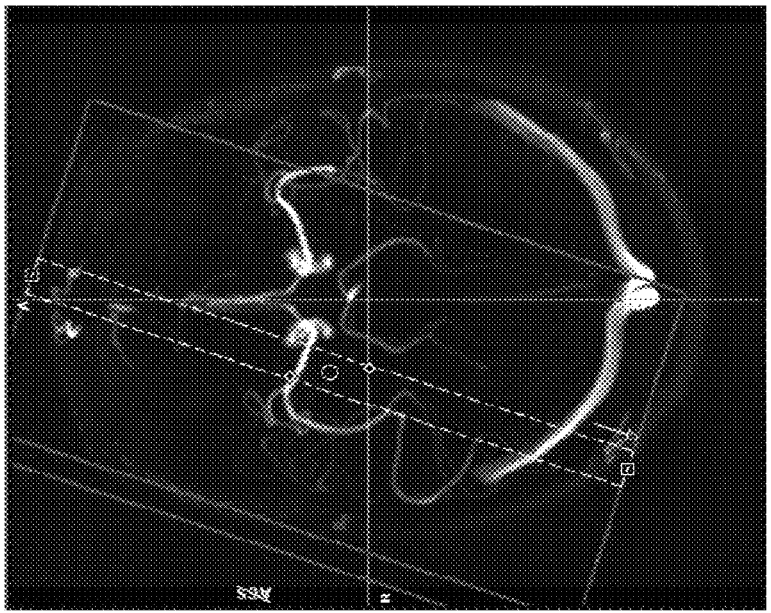
FIG. 1A shows an example of slice positioning over the MCA using the phase contrast scan as a guide.

According to an aspect of the present disclosure, the MRI magnitude signal is retrospectively gated to the cardiac cycle, by retrospectively binning data into different cardiac phases which allows the pulsatile flow profile to be extracted. The use of an ultra-fast segmented EPI readout maximises sensitivity to flow in the magnitude signal, without the need for velocity encoding gradients, thus allowing pulsatile flow to measured dynamically on a cardiac beat-to-beat basis.

The present disclosure provides a method in which a single image slice is repeatedly imaged by an MRI method at a short interval. This may be termed "multi-shot" (segmented) EPI and such readout method increases saturation in static tissue, thereby to increase sensitivity to magnetic resonance imaging in inflowing material.

In "multi-shot" (segmented) EPI, RF pulses are applied more rapidly than the static tissue can recover from resonance induced by a previous RF pulse. This is known as saturation and results in a reduced signal in resulting image data. In the case of incoming blood flow, magnetic resonance will not previously have been induced in newly-arriving blood flow; it will not be saturated. Therefore, newly-arrived blood will produce a stronger response to the first imaging step it encounters. This is the inflow effect: newly arrived material (in this case, blood) will produce a stronger MRI response than material which is at least partly saturated from a previous imaging sequence. As blood which has arrived in the time interval since the previous imaging sequence is highlighted, the methods of the present disclosure provide a clear measurement of pulsatile flow.

In embodiments of the present disclosure, the short interval between imaging sequences and the resulting high temporal resolution is enabled by repeatedly imaging a small volume of matter, for example a single EPI slice.

In some embodiments of the disclosure, a partial Fourier transform and parallel imaging approach is adopted. An MRI response signal is measured in a reciprocal space, and the signal is calculated in the geometrical space by fast Fourier transform (FFT). In the partial Fourier transform step, the signal is acquired from only a portion of the reciprocal space: the signal is acquired only on a fraction on one side of the reciprocal space, and the corresponding information from the other side is mirrored to fill the missing information by assuming reciprocal space symmetry. Parallel Imaging is the technique that allows to further reduce the points of the reciprocal space to be acquired, by using more receiver elements, such as RF probes or RF coils. Thus, a high spatial and/or spatial resolution may be obtained.

A high temporal resolution is obtained in order to accurately sample pulsatile flow. The properties of the pulsatile flow profile yield clinically useful information regarding downstream vascular resistance and vessel compliance.

The present disclosure enables improved studies into how cardiovascular risk relates to cerebrovascular risk, for example by improving studies of properties of the MRI EPI signal by investigating in a varied biological age range sample, and primarily compare to a measure of aortic stiffness.

The present disclosure accordingly provides a method for assessing vascular resistance and compliance in large cerebral arteries by specifically exploiting with high temporal resolution the inflow effect on the magnitude of MRI signal. The method of the present disclosure employs ultra-fast segmented echo planar imaging (EPI). By retrospectively gating the signal to the cardiac cycle, by retrospectively binning data into different cardiac phases, allows the pulsatile flow profile to be extracted, synchronised to the cardiac cycle. The use of an ultra-fast segmented EPI readout maximises sensitivity to flow in the magnitude signal, without the need for velocity encoding gradients, thus allowing pulsatile flow to be measured dynamically on a cardiac beat-to-beat basis. The multi-shot EPI readout increases saturation of static material to increase sensitivity to flowing material, and parallel imaging combined with Phase-Partial Fourier approach maintains a high temporal resolution in order to accurately sample pulsatile flow.

The method of the present disclosure provides high specificity to inflow effects. This is achieved by rapid MRI EPI imaging which keeps static tissue in a saturated state, while arriving blood is unsaturated at its first imaging sequence and provides a stronger MRI imaging response. The method may be applied during a standard clinical MRI visit: it is non-invasive and necessitates only a few minutes to provide reliable clinical data.

In preferred embodiments, the method of the present disclosure involves using an ultrafast segmented acquisition. The segmentation: use of multiple RF pulse in acquisition of a single EPI image slice allows very short radiofrequency pulses separation time (for example, less than 10 ms). This approach results in a high saturation of the static tissue signal, providing specificity of the acquired signal to inflowing material.

The mechanism behind the saturation is that continuous fast measurement of a static sample does not allow for full recovery of the longitudinal magnetisation, when the rate of measurement is much shorter than the T1 of the sample, and so saturation of the available magnetisation occurs. The efficiency depends primarily on short TR, flip angle, the velocity of the flowing spins, and the thickness of the imaging slice/slab. It is also dependent on T1 of the sample and therefore on field strength, and so a stronger blood-based inflow effect is observed at a background static field strength of 7 T compared with a background static field strength of 3 T. TOF angiography at background static field strength of 7 T may enable smaller cerebral arteries to be observed than would be the case at lower background static field strength.

The improved temporal resolution enabled by the present disclosure is allowed by a very short acquisition time (TA) of a single slice in MRI EPI, for example less than 100 ms. Short intervals between RF acquisition is enabled and obtained by 1) segmentation of an EPI sequence; 2) eliminating events not strictly necessary to generate the required gradient echo signal; 3) by acquiring during the phase encoding gradients; 4) by applying Phase-Partial Fourier. The short acquisition time TA, other than by the previous point, is further enabled by adopting a high parallel imaging acceleration factors (which may be known as GRAPPA) and thereby reducing the number of RF shots needed to acquire one slice. Up to five shots may still be required through the use of multichannel receiver coils. An example of an acquisition scheme of the present disclosure is shown in FIG. 5.

Acquired image data may be averaged over a period of time. For example, six minutes' worth of image data may be synchronised to the cardiac cycle and collated together to provide an averaged image data set for one cardiac cycle.

The present disclosure method may enable high clinical impact in assessing specific aspects of heart-brain interaction and provide reliable information in cerebrovascular clinical protocols. Studies may be conducted in a varied biological age range sample, and compared to a measure of aortic stiffness to understand how cardiovascular risk relates to cerebrovascular risk.

Further details of the present disclosure will be discussed below in the context of more specific embodiments:

Cerebrovascular function in the middle cerebral artery may be measured using the cardiac-induced inflow effect on fast echo-planar imaging.

Cardiac-induced pulsatile flow-related signal enhancement in fast EPI sequences provides a dynamic assessment of cerebrovascular function in the large feeding arteries of the brain. Cardiac pulsatile waveforms, derived from magnitude data taken at the site of the middle cerebral artery, are attenuated at longer TRs, demonstrating they are related to pulsatile flow rather than volume changes. The same waveforms are modulated by a global flow-increasing hypercapnic challenge (Hypercapnia: abnormally elevated carbon dioxide ($CO_2$) levels in the blood), showing that this endogenous signal contrast can be useful for exploring dynamic cerebrovascular function. A multi-shot segmented EPI approach is found to further increase this signal contrast.

Important parameters of cerebrovascular health such as vessel wall compliance, impedance and reflection can be obtained by studying pulsatile changes in blood volume and flow velocity that are the result of the cardiac induced pressure wave. A conventional method recently optimized a fast non-gated EPI sequence to be sensitive to cardiac induced cerebral blood volume (CBV) changes. The present disclosure adopts a similar approach to create a contrast that is predominantly weighted towards cerebral blood flow velocity (CBFV) changes using a fast EPI readout with a very short TR, a 90° flip angle and a relatively thick slice.

Multi-shot segmented EPI approaches are found desirable for this application in exploiting flow related enhancement of the magnitude signal in fast EPI.

Image acquisition: A Siemens 3T MAGNETOM Prisma clinical scanner equipped with a 32-channel receiver head coil (Siemens Healthcare GmbH, Erlangen) was used to acquire data in 5 healthy adults. A phase contrast scan was used to localise subsequent EPI scans, which were positioned over a segment of the right middle cerebral artery (MCA) that best approximated a perpendicular transaction. FIG. 1A shows a corresponding example of slice positioning over the MCA using the phase contrast scan as a guide.

FIGS. 1B-1 through 1B-4 show mean data for four different TRs from a representative subject. Twelve combinations of ~60 s scans were acquired using a gradient-echo EPI sequence for each patient. The various scans were performed under four different TR conditions (TR), three different hypercapnia conditions (HC). The scans were acquired with the following parameters: TR=15/30/60/120 ms, dynamics=4096,2048,1024,512, TE=6.8 ms, flip angle=90°, FOV=192 mm (2 mm$^2$ in-plane resolution), GRAPPA=5, bandwidth=2500 Hz/Px. Each TR represents a different magnetic saturation level in $O_2$ in the imaged region. The three HC conditions were achieved by manually targeting $P_{ET}CO_2$ to three respective discrete levels relative to baseline. The three levels used were no hypercapnia (+0), a +4 mmHg block (+4), and a +8 mm Hg block (+8). A pulse oximeter and a belt were used to record the pulse and respiratory waveforms respectively.

Figure 2:
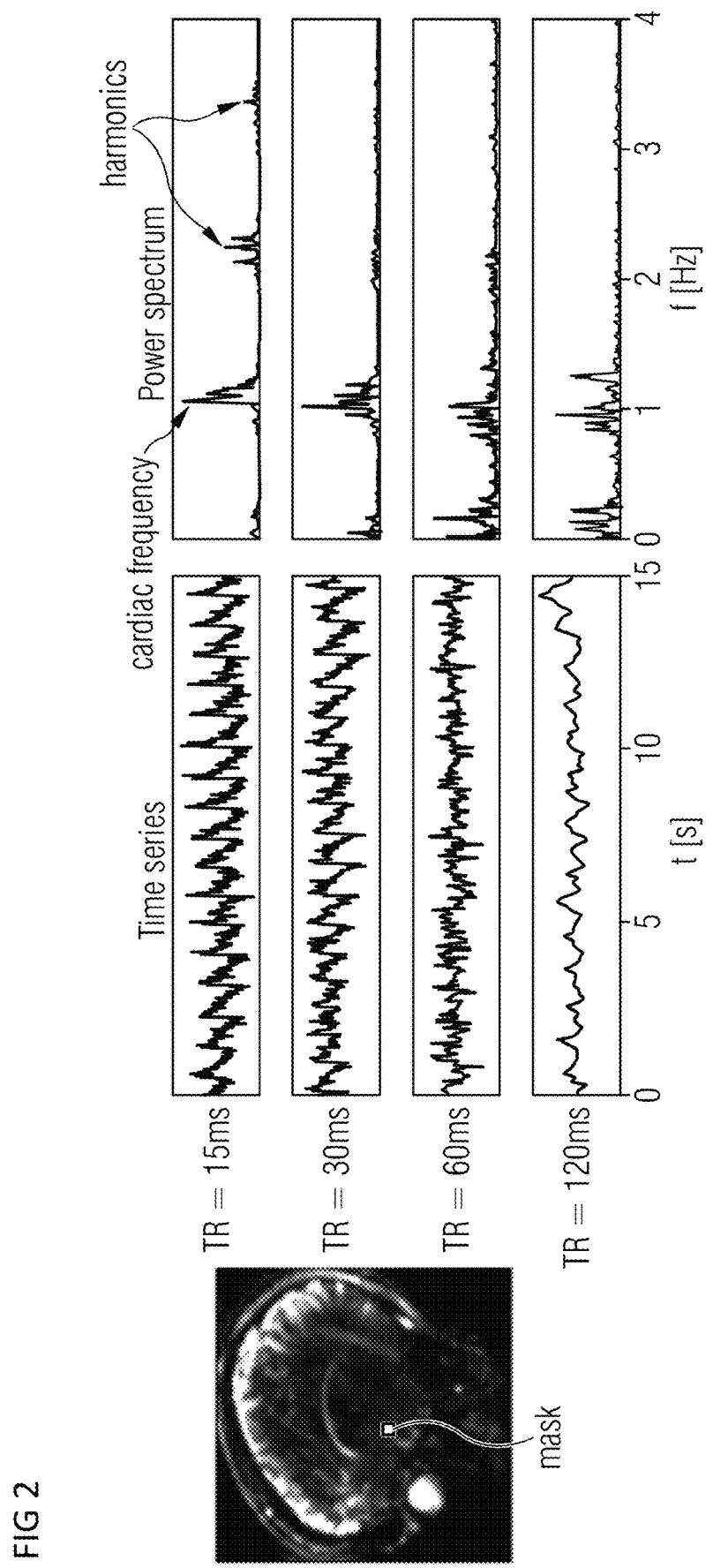
Figures 1, 4B:
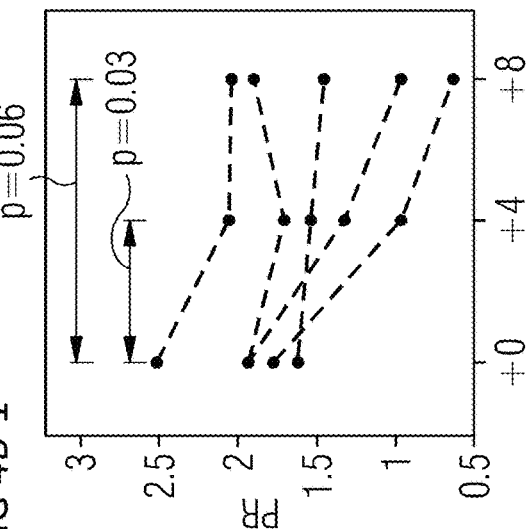
Figures 2, 4B:
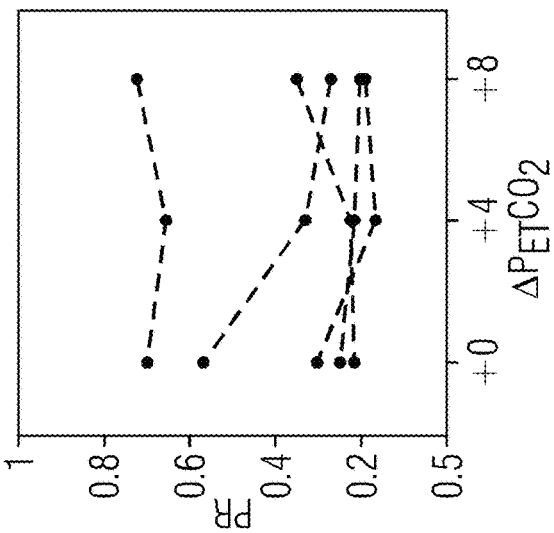
Figure 4A:
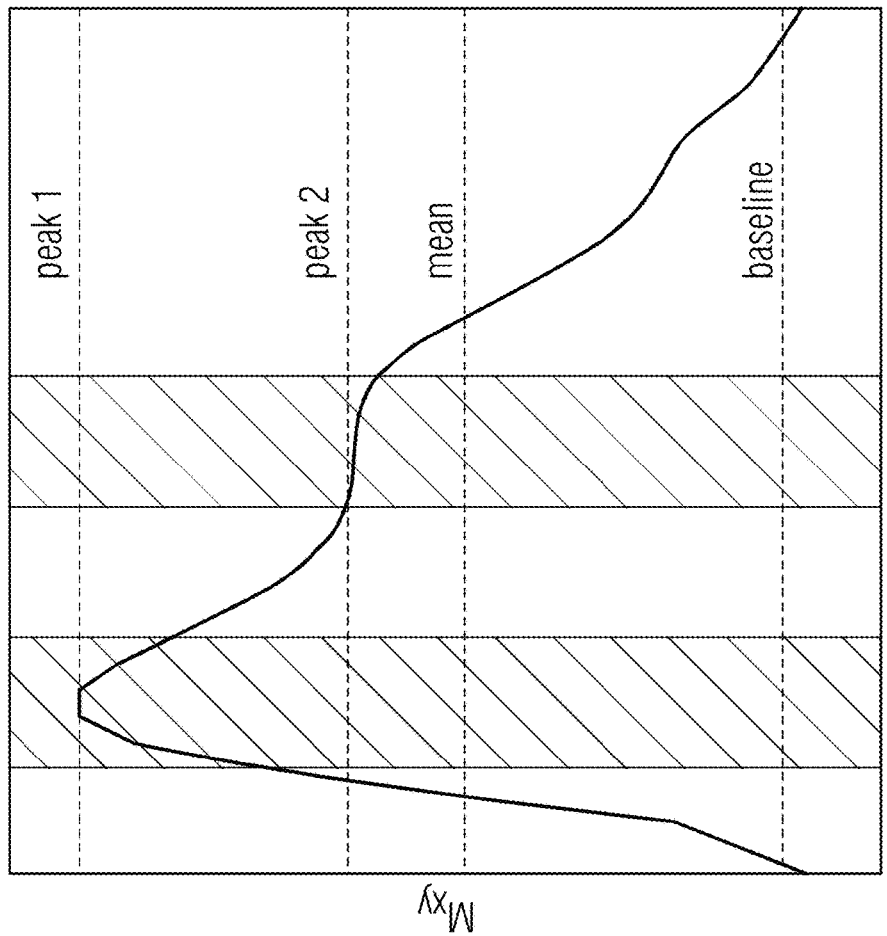

Data analysis: After motion correction and removal of linear trends and respiratory noise, data were retrospectively gated to the cardiac cycle by retrospectively binning into different cardiac phases using pulse oximeter traces to create a single cardiac waveform. A mask of nine voxels centred on the voxel of peak mean intensity in the MCA region was created, and the mean cardiac waveform calculated. To facilitate a quantitative analysis of cardiac waveforms, a Pulsatility Index (PI) and Peak Ratio (PR) measure were calculated for each condition, as illustrated in FIGS. 4A, 4B-1, and 4B-2. In FIG. 4A shows features of the transverse magnetization pulsatile waveform and definitions for quantitative waveform analysis; FIGS. 4B-1 and 4B-2 show scatter plots for Peak Ratio (PR) and Pulsatility (PI) indices across multiple hypercapnia conditions. As illustrated, there is a significant difference in PR between +0 and +4 HC conditions (paired t-test, p<0.05) and a trend in difference between +0 and +8 HC conditions (paired t-test, p=0.06).

FIG. 2 displays results of the MCA time series and corresponding power spectrum for each TR; the power at the cardiac primary and harmonic frequencies reduces as a function of TR: Time series and power spectra from the mask averaged time series for HC +0 condition for a representative subject. The fundamental cardiac frequency can be observed for all TRs, but higher order harmonics are attenuated for longer TRs.

FIGS. 3A and 3B demonstrate that the strongest cardiac waveform is in the TR15 scan, with TR30 showing less defined peaks. TR60 and TR120 lack discernible cardiac waveforms. FIG. 3A illustrates group mean transverse magnetization cardiac waveforms, over one cardiac cycle, for each TR and HC condition; FIG. 3B illustrates group mean, and within-subject error, transverse magnetization waveforms for TR15 over one cardiac cycle. Qualitatively, a modulation of the waveforms by HC can be observed. Since the sequence is increasingly sensitive to inflow at the shortest TRs, these results suggest that the measured cardiac waveforms are directly related to CBFV pulsatility.

Two clearly resolved peaks are present in the TR15 waveform; the second possibly representing the reflected wave, which is observed in TCD measures of CBFV in MCA. For TR15, a clear separation is observed between waveforms for the different $P_{ET}CO_2$ levels, as illustrated in FIG. 3B. There is no significant modulation of PI by hypercapnia, but the PR is attenuated at +4 mm Hg compared to +0 (p=0.03), and the same trend is observed at +8 mmHg (p=0.06) (compared to +0).

In this embodiment, fast EPI is used to demonstrate strong cardiac pulsatility in the magnitude signal in region of the MCA, which is attenuated with increasing TR, indicating a signal contrast that is primarily flow dependent. Properties of the pulsatile waveform, such as the ratio between the primary and secondary peak, appear to be modulated by hypercapnia, which causes global vasodilation of downstream vessels and potentially dilation of the MCA itself. This suggests that this magnitude based contrast mechanism is sensitive to vascular changes that occur within subjects, and thus may be useful for characterising dynamic cerebrovascular properties with high sensitivity.

However, confidence in these data is undermined by its coarse spatial resolution, which means CBV and partial volume effects may confound the results. With single-shot EPI, higher spatial resolution necessarily requires a longer TR, which as demonstrated here attenuates the inflow effect. The present disclosure accordingly proposes a multi-shot segmented EPI approach as additional lines of k-space could be acquired without sacrificing the saturation effect. Shorter time between RF pulses would allow thinner slices to be acquired without losing sensitivity to flow velocities.

The high sampling rate afforded by a magnitude based EPI approach allows analysis of the cardiac waveform on a beat-to-beat basis, which could be informative for understanding dynamic changes in vascular compliance and downstream resistance.

Different acquisition schemes may in principle be used, such as gradient echo. Some aspects concerning the quality of the signal may be improved by using slightly different acquisition schemes. Such embodiments must however maintain high temporal resolution, and the ability of sampling the cardiac cycle with high temporal resolution. Different compressed sampling of k-space may also be beneficial, but it necessitates a-priori knowledge that may be attained only through preliminary pilot and clinical applications.

According to the present disclosure, the inflow effect in MRI EPI imaging is exploited for improved measurement of cardiac induced pulsatile changes in cerebral blood flow velocity, particularly in large arteries but also in smaller blood vessels and even, in some embodiments, to microvasculature. The technique is preferably applied to a single slice placed perpendicular to a major cerebral artery.

A short TR is used, to obtain high temporal resolution. On the other hand, this limits the achievable spatial resolution. Multiple-shot (i.e., multiple RF pulse) segmented EPI readout allows a whole plane of k-space to be captured in an MRI EPI image data frame, achieving a higher spatial resolution because a saturation effect can be maintained by each shot, but image data from several shots may be collated to form a high-resolution image of a slice. In an example, a whole plane of k-space may be acquired in 50 ms, and this may be made up of five shots (RF pulses), each providing image data in a time period of 10 ms. This is the "segmentation" of the EPI imaging: partial data sets are captured in response to each RF pulse, and those partial data sets collated into a full image data frame representing a single EPI data slice. The five resulting data sets are collated into a single data set of high spatial resolution. The repetition of RF pulses at 10 ms intervals maintain a high level of saturation, thereby providing high temporal resolution. In an example embodiment, one hundred time points may be imaged during a single cardiac cycle. The increased temporal and spatial resolution enable separation of effects to be deduced: for example, separation of effects due to volume of flow or due to velocity of flow. There may be some incoming blood which flows in a counter-direction for a part of the cardiac cycle. This may be detected and evaluated by the high temporal and spatial resolution provided by the present disclosure.

Magnetic saturation may also enable the separation of data derived from arterial blood flow, which has a higher oxygen content than venous blood flow. High temporal and spatial resolution data may be acquired by measuring oxygenation in the blood flow in the blood vessels under evaluation. The response level and reaction speed of the blood to an applied RF pulse is dependent on its oxygenation level, so different saturation effects arise for different types of blood, enabling them to be distinguished in the acquired MRI data.

The saturation effect is most marked on static tissue. Conventionally, static tissue provides a very large signal, obscuring the image signal from blood volume. A rapid sequence of RF pulses, at a period rather shorter than the recovery time TR) ensures that the static tissue remains magnetically saturated to reduce its response. The shorter the period between RF pulses, the greater the level of saturation maintained in the static tissue.

The described properties TR and oxygenation level represent two dimensions that enable different effects to be distinguished within the image data.

ABBREVIATIONS/DEFINITIONS

MRI Magnetic Resonance Imaging
TR Repetition time (recovery time?)
CBV cerebral blood volume
CBVF Cerebral blood volume flow
EPI echo-planar imaging
Endogenous having an internal cause or origin
T1 longitudinal relaxation time of magnetisation
TR recovery time
TOF time of flight
TA acquisition time
TE transverse relaxation time of magnetisation
FOV Field Of View
GRAPPA GeneRalised Autocalibrating Partial Parallel Acquisition
Px Pixel
PI Pulsatility Index
PR Peak ratio
FFT Fast Fourier Transform
MCA Middle Cerebral Artery
HC Hypercapnia

The invention claimed is:

1. A method for obtaining magnetic resonance imaging (MRI) echo-planar image (EPI) data, comprising:
   providing a homogeneous, static background field;
   providing a gradient field to select a slice of an object for imaging;
   applying Radio-Frequency (RF) pulses to excite magnetic resonance in the selected slice, wherein the RF pulses are repeatedly applied separated by a time period shorter than a recovery time of static material in the selected slice such that the static material remains in a state of magnetic saturation, while dynamic material arriving within the slice since a previous RF pulse is not magnetically saturated; and
   measuring an RF signal emitted by the selected slice having image data.

2. A method according to claim 1, wherein an image frame representing the slice is collated from partial image data obtained from each of a plurality of consecutive RF pulses, and image data resulting from each of the consecutive RF pulses representing partial data of the slice.

3. A method according to claim 2, wherein consecutive image frames are obtained from a sequence of RF pulses, each image frame representing the slice and being collated from partial image data obtained from each of a plurality of consecutive RF pulses, and image data resulting from each of the consecutive RF pulses representing partial data of the slice.

4. A method according to claim 1, wherein data is obtained representing a cyclic variation in composition of the slice, such that a time interval between acquisition of consecutive frames of image data of the slice is less than a period of the cyclic variation.

5. A method according to claim 4, wherein the time interval between acquisition of consecutive frames of image data of the slice is such that one hundred time points are imaged during a single period of the cyclic variation.

6. A method according to claim 1, wherein acquired image data is averaged over a number of cycles of the cyclic variation to provide an averaged set of image data frames for one cycle of the cyclic variation.

* * * * *